United States Patent [19]
Wu et al.

[11] Patent Number: 5,837,585
[45] Date of Patent: Nov. 17, 1998

[54] METHOD OF FABRICATING FLASH MEMORY CELL

[75] Inventors: Shye-Lin Wu, Hsinchu Hsien; Bu-Chin Chung, Taipei, both of Taiwan

[73] Assignee: Vanguard International Semiconductor Corporation, Hsinchu, Taiwan

[21] Appl. No.: 685,306

[22] Filed: Jul. 23, 1996

[51] Int. Cl.[6] .................................. H01L 21/8247
[52] U.S. Cl. .................... 438/264; 438/257; 438/528; 438/585; 438/910
[58] Field of Search ........................ 438/257, 261, 438/264, 528, 585, 591, 600, 762, 786, 910, 954

[56] References Cited

U.S. PATENT DOCUMENTS

| | | | |
|---|---|---|---|
| 4,774,197 | 9/1988 | Haddad et al. | 438/954 |
| 5,215,934 | 6/1993 | Tzeng | 438/264 |
| 5,266,510 | 11/1993 | Lee | 438/528 |
| 5,407,870 | 4/1995 | Okada et al. | 438/591 |
| 5,464,792 | 11/1995 | Tseng et al. | 438/910 |
| 5,571,734 | 11/1996 | Tseng et al. | 438/591 |
| 5,620,913 | 4/1997 | Lee | 438/264 |
| 5,712,208 | 1/1998 | Tseng et al. | 438/923 |
| 5,726,087 | 3/1998 | Tseng et al. | 438/261 |

*Primary Examiner*—Charles L. Bowers, Jr.
*Assistant Examiner*—Jack Chen
*Attorney, Agent, or Firm*—Christensen, O'Conner, Johnson & Kindness PLLC

[57] ABSTRACT

The present invention discloses a method of fabricating flash memory cell for use in semiconductor memories. A nitrogen implantation step is added in the process to increase the performance of the device. The nitrogen implanted tunnel oxide exhibits a much higher electron conduction efficiency than the prior art tunnel oxides in both injection polarities. The value of charge-to-breakdown voltage of the nitrogen implanted tunnel oxide is also much larger than the narrow tunnel oxide. In addition, the electron trapping rate of the nitrogen implantation tunnel oxide is very small even under a very large electron fluence stressing (100 C/cm$^2$).

11 Claims, 2 Drawing Sheets

METHOD OF FABRICATING FLASH MEMORY CELL

FIELD OF THE INVENTION

The present invention relates to a method of fabricating a flash memory cell, and more specifically, to a method of fabricating a thin tunnel oxide with high electron injection efficiency using nitrogen implantation.

BACKGROUND OF THE INVENTION

Toward the end of the 1980s the semiconductor industry developed the electrically erasable PROM or EEPROM. The result was that a new generation of memories targeted at the low cost, high density memory market evolved. The term 'flash' was given to this new category of memory as a result of the electrical erasability of the memory cells. The term 'flash' historically had been used to describe a mode of programming or erasing an entire memory array at one time. The flash memory is programmed by hot electron injection at the drain edge and erased by Fowler-Nordheim tunneling from the floating gate to the source, with the control gate grounded.

Many of the flash memory manufacturers chose a thin oxide floating gate process to make an electrically erasable PROM. The basic cell consists of access transistors and a double polysilicon storage cell with a floating polysilicon gate isolated in silicon dioxide capacitively coupled to second polysilicon control gate which is stacked above it. The storage transistor is programmed by Fowler-Nordheim tunneling of electrons through a thin oxide layer between the gate and the drain of the transistor. The thin tunneling oxide generally is about 10 nm or 100 angstroms. Unfortunately, it is difficult to efficiently fabricate a thin tunnel oxide with a high electron injection efficiency and a large charge-to-breakdown ($Q_{bd}$) for the application of low voltage memories.

SUMMARY OF THE INVENTION

In the present invention, a novel method is disclosed to fabricate a tunnel oxide with a very high electron injection efficiency and a very large charge-to-breakdown voltage. In addition, the disclosed tunnel oxide has a lower electron trapping rate for advanced low-voltage flash memory. A nitrogen implantation step is performed to enhance the behavior of the flash memory cell. The nitrogen implantation is done through polysilicon layer and silicon dioxide layer into the silicon substrate. The peak value of nitrogen concentration, known in the art as projected range $R_p$, is occured at the interface of substrate and tunnel oxide.

In accordance with other aspects of the present invention, a method of fabricating a flash memory cell is disclosed. The method comprises forming a first silicon oxide layer on a semiconductor substrate, forming a first polysilicon layer on the first silicon oxide layer, doping nitrogen ions through the first polysilicon layer and the first silicon oxide layer into the silicon substrate, forming a second silicon oxide layer on the first polysilicon layer, forming a second polysilicon layer on the second silicon dioxide layer, etching the second polysilicon layer, the second silicon oxide layer, the first polysilicon layer and the second silicon dioxide layer to form a composition gate structure, and forming impurity regions by using ions implantation.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

In the present invention, a novel method is disclosed to fabricate an EEPROM memory cell with a tunnel oxide with a very high electron injection efficiency and a very large charge-to-breakdown voltage. The peak value of nitrogen concentration, known in the art as projected range $R_p$, is at the interface of substrate and tunnel oxide. The resultant-tunnel oxide also has a lower electron trapping rate. The use of nitrogen implantation to form the tunnel oxide is particularly suited for use in advanced low-voltage flash memory, such as EEPROMs and non-volatile DRAMs or NVDRAMs.

In the programming mode for flash memory, hot carriers tunnel from the channel to the floating gate and are stored in the floating gate. The control gate, the select gate and the drain of the flash memory cell are positively biased while the source is grounded. In erase mode, the drain is biased at high voltage. In addition, the present invention uses nitrogen implantation to improve the electron injection efficiency and provide larger charge-to-breakdown voltage.

The formation of the flash memory cell includes many process steps that are well known in the art. For example, the process of photolithography masking and etching is used extensively herein. This process consists of creating a photolithography mask containing the pattern of the component to be formed, coating the wafer with a light sensitive material known as a photoresist, exposing the photoresist coated wafer to ultra-violet light through the mask to soften or harden parts of the photoresist (depending on whether positive or negative photoresist is used), removing the softened parts of the photoresist, etching to remove the materials left unprotected by the photoresist and stripping the remaining photo-resist. This photolithography masking and etching process are referred to as "patterning and etching."

Figure 1:
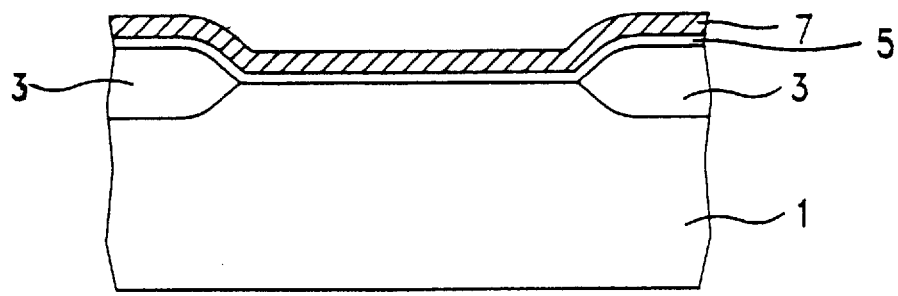
FIG. 1 is a cross section view of a semiconductor wafer illustrating the step of forming a first silicon oxide layer, first polysilicon layer.

As will be seen below, this technique can be used to form a flash memory cell. Referring to FIG. 1, in the preferred embodiment, a single crystal substrate 1 is used. Preferably, the single crystal substrate 1 is P-type with a <100> crystallographic orientation. Typically, the gate of the flash memory is formed atop the substrate 1. Similarly, source and drain impurity regions are formed in the substrate 1 adjacent to the gate. A thick field oxide region (FOX) 3 is created for purposes of isolation. Generally speaking, the FOX 3 region is created via photolithography and dry etching steps to etch a silicon nitride-silicon dioxide composite layer. After the photoresist is removed and wet cleaned, a thermal oxidation in an oxygen steam ambient is used to form the FOX 3 region, to a thickness about 4000–6000 angstroms.

Initially, a first silicon oxide layer 5 is created atop the substrate 1 to act as the tunnel oxide. In the preferred embodiment, the first silicon oxide layer 5 is formed by using an oxygen-steam ambient, at a temperature between about 850° to 1000° C. Alternatively, the thin tunnel oxide may be formed using other known oxide chemical compositions and procedures. As is known in the art, by controlling the pressure and time at which the oxygen-steam ambient is exposed to the substrate, the thickness of the silicon dioxide layer 5 can be easily controlled. In the preferred embodiment, the thickness of the first silicon oxide layer 5 is approximately 50–300 angstroms.

Still referring to FIG. 1, after the first silicon oxide layer 5 is formed, a first polysilicon layer 7 is formed over the first silicon oxide layer 5 and the field oxide regions 3. In the preferred embodiment, the first polysilicon layer 7 is formed by using conventional chemical vapor deposition (CVD). It can be appreciated that other methods of depositing the first polysilicon layer 7 can also be used. The first polysilicon layer 7 is chosen from doped polysilicon or in-situ doped polysilicon. The thickness of the first polysilicon layer 7 is preferably about 1000–3000 angstroms.

Figure 2:
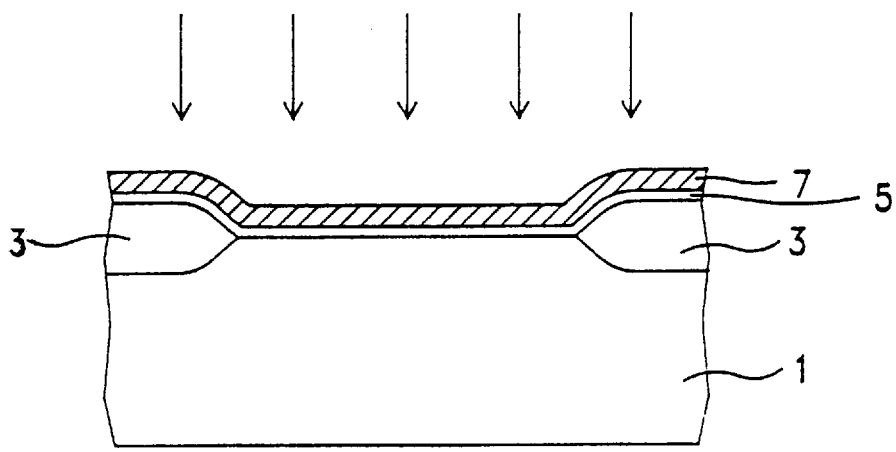
FIG. 2 is a cross section view of a semiconductor wafer illustrating the step of implanting nitrogen ions.

Turning to FIG. 2, the next step in the manufacturing process is to perform a nitrogen implantation. It has been discovered that by performing a nitrogen implantation, the performance of the thin tunnel oxide, and thus, the flash memory cell formed therefrom, is greatly improved. The nitrogen implantation is performed through the first polysilicon layers 7 and the first silicon oxide layers 5, and into the silicon substrate 1. In the preferred embodiment, the energy of the implantation is 50–180 keV, the dosage of the implantation is 5E14-1E17 atoms/cm$^2$. In addition, the peak value of nitrogen concentration, known in the art as projected range $R_p$, is occurred at the interface of substrate and tunnel oxide, In addition, the width of the Gaussian distribution of nitrogen ion, or commonly known as $\Delta R_p$, is 523 angstroms. It has also been found that implantation using the elements of argon and germanium are also effective.

The nitrogen implanted thin tunnel oxide formed in accordance with the present invention exhibits a much higher electron conduction efficiency than the normal thin tunnel oxide in both injection polarities. The charge-to-breakdown voltage of the nitrogen implanted tunnel oxide (i.e., the first silicon oxide layer 5) is also much larger than prior art tunnel oxide. Moreover, time before breakdown of a tunnel oxide formed in accordance with the present invention is greater than 1000 seconds compared to 170 seconds for a typical prior art thin tunnel oxide. In addition; the electron trapping rate of the nitrogen implanted thin tunnel oxide is very small even under a very large electron fluence stressing (100 C/cm$^2$).

Figure 3:
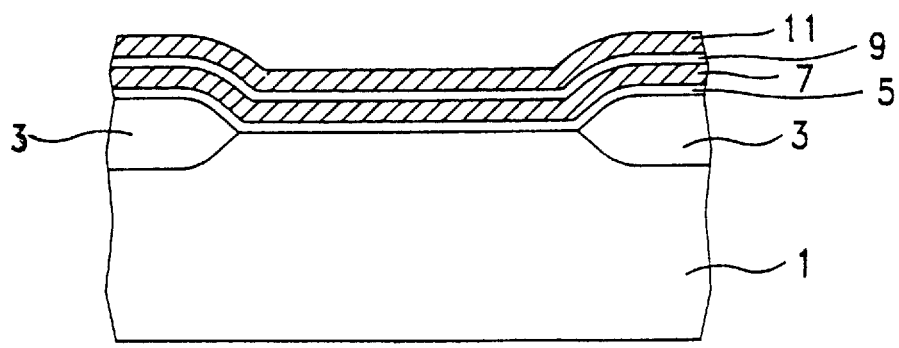
FIG. 3 is a cross section view of a semiconductor wafer illustrating the step of forming a second polysilicon layer and a second silicon oxide.

Turning to FIG. 3, a second silicon oxide layer 9 is formed atop the first polysilicon layer 7 for the purpose of electrically isolating the first polysilicon layer 7. It can be appreciated that other types of insulating materials may be used instead of silicon oxide. Similarly, the second silicon oxide layer 9 can be formed by using thermal oxidation or any other well known process.

Finally, a second polysilicon layer 11 is formed atop the second silicon oxide layer 9. The thickness of the second polysilicon layer 11 is preferably approximately 1000–3000 angstroms. In the preferred embodiment, the second polysilicon layer 11 is formed by using conventional chemical vapor deposition (CVD). It can be appreciated that other methods of depositing the second polysilicon layer 11 can also be used. The second polysilicon layer 11 is chosen from doped polysilicon or in-situ doped polysilicon.

Figure 4:
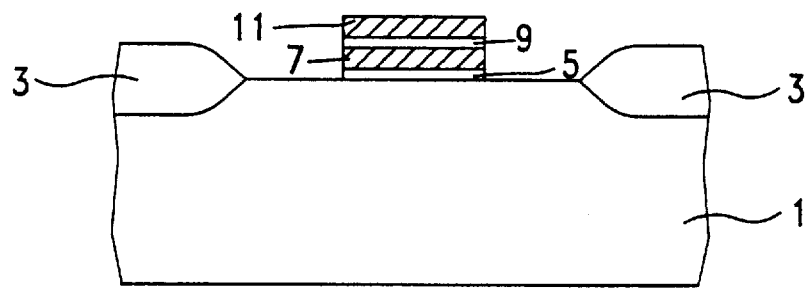
FIG. 4 is a cross section view of a semiconductor wafer illustrating the step of forming a gate structure.

Turning to FIG. 4, a patterning and etching is next used to etch the first silicon oxide layer 5, the first polysilicon layer 7, the second silicon oxide layer 9, and the second polysilicon layer 11 to form a composition gate structure. The flash memory cell utilizes the second polysilicon layer 11 as the control gate. The second silicon oxide layer 9 serves as the gate isolation layer. The first polysilicon layer 7 serves as a floating gate. Finally, the first silicon oxide layer acts as the thin tunnel oxide.

Figure 5:
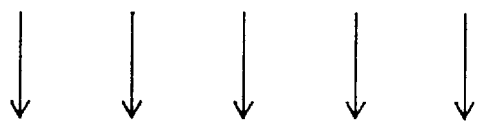
FIG. 5 is a cross section view of a semiconductor wafer illustrating the step of forming impurity regions.
Figure 5:
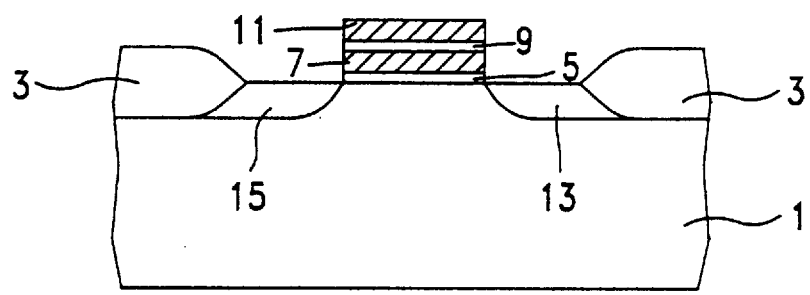

The final step in the process of the present invention is shown in FIG. 5. In particular, an ion implantation is used to create the doped impurity regions 13, 15 also referred to as the source and drain.

As is understood by a person skilled in the art, the foregoing preferred embodiment of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. For example, although the description herein has been made in connection with an EEPROM, the method of nitrogen implantation can be used in connection with non-volatile DRAMs or NVDRAMs. Thus, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of fabricating a flash memory cell comprising:

forming a tunnel oxide layer on a semiconductor substrate;

forming a first polysilicon layer on said tunnel oxide layer;

doping nitrogen ions through said first polysilicon layer and said tunnel oxide layer into said silicon substrate, wherein the step of said doping nitrogen ions results in a peak concentration of nitrogen ions occurring at an interface of said substrate and said tunnel oxide;

forming an insulating layer on said first polysilicon layer;

forming a second polysilicon layer on said insulating layer;

etching said second polysilicon layer, said insulating layer, said first polysilicon layer and said tunnel oxide to form a gate structure; and forming doped impurity regions adjacent said gate structure by using ion implantation.

2. The method of claim 1, wherein said insulating layer and said tunnel oxide layer are comprised of silicon oxide.

3. The method of claim 1, wherein said second polysilicon layer is formed to have a thickness of approximately 1000–3000 angstroms.

4. The method of claim 1, wherein said first polysilicon layer is formed to have a thickness of approximately 1000–3000 angstroms.

5. The method of claim 1, wherein said tunnel oxide layer is formed to have a thickness of approximately 50–300 angstroms.

6. The method of claim 1, wherein said step of doping nitrogen ions is performed at an implantation energy of approximately 50–180 keV and the dosage of said implantation is 5E14-1E17 atoms/cm$^2$.

7. The method of claim 1, wherein said first polysilicon layer serves as a floating gate.

8. The method of claim 1, wherein said second polysilicon layer serves as a control gate.

9. The method of claim 1, wherein said first polysilicon layer and said second polysilicon layer are doped polysilicon.

10. The method of claim 1, wherein said first polysilicon layer and said second polysilicon layer are in-situ doped polysilicon.

11. A method of fabricating a flash memory cell comprising:

forming a tunnel oxide layer on a semiconductor substrate;

forming a first polysilicon layer on said tunnel oxide layer;

doping with ions from the group of nitrogen, argon, or germanium through said first polysilicon layer and said tunnel oxide layer into said silicon substrate, wherein said doping results in a peak concentration of ions occurring at an interface of said substrate and said tunnel oxide;

forming an insulating layer on said first polysilicon layer;

forming a second polysilicon layer on said insulating layer;

etching said second polysilicon layer, said insulating layer, said first polysilicon layer and said tunnel oxide to form a gate structure; and forming doped impurity regions adjacent said gate structure by using ion implantation.

* * * * *